Jan. 7, 1964 B. G. MAGNUSSON 3,117,273

LOW-LOSS VOLTAGE CONTROL CIRCUIT

Filed July 9, 1959 2 Sheets-Sheet 1

INVENTOR.
BENGT-GUNNAR MAGNUSSON
BY
Strauch, Nolan & Neale
ATTORNEYS

Jan. 7, 1964 B. G. MAGNUSSON 3,117,273

LOW-LOSS VOLTAGE CONTROL CIRCUIT

Filed July 9, 1959 2 Sheets-Sheet 2

INVENTOR.
BENGT-GUNNAR MAGNUSSON
BY
Strauch, Nolan + Neale
ATTORNEYS

The United States Patent Office 3,117,273 Patented Jan. 7, 1964

1

3,117,273

LOW-LOSS VOLTAGE CONTROL CIRCUIT

Bengt Gunnar Magnusson, 15 Dejegatan, Farsta-Stockholm, Sweden

Filed July 9, 1959, Ser. No. 825,963
Claims priority, application Sweden Aug. 29, 1958
5 Claims. (Cl. 323—22)

The present invention relates to a device for automatically limiting the losses in a series transistor in a direct current control device of the known type in which the load current flows through the series transistor and which comprises an amplifier for controlling the series transistor. This amplifier has its input connected across the load and is arranged to control the series transistor in such a way that the voltage across the load becomes substantially independent of changes in the load and the power supply source but will bear a certain relation to a reference voltage from a direct voltage source included in the amplifier. This relation is determined by certain resistances in the amplifier at least one of which is variable so that the load voltage can be adjusted by means of this resistance to any desired value within very wide limits.

Across the series transistor there will be a voltage drop which is equal to the difference between the power supply voltage and the load voltage. If the load voltage is varied without the supply voltage being correspondingly changed at the same time, the voltage across the series transistor may assume very high values, and the power losses in the series transistor, that is the product of said voltage drop and the load current, may become very high. It is an object of the present invention to provide means for automatically limiting these losses.

The device according to the invention comprises a difference circuit for comparing the voltage across the series transistor with a reference direct voltage and means responsive to the difference voltage to control a regulating device operating with low losses for regulating the supply voltage so that changes in the load voltage are accompanied by corresponding changes in the supply voltage.

The invention will be described more in particular in conjunction with the accompanying drawings.

Figure 1:
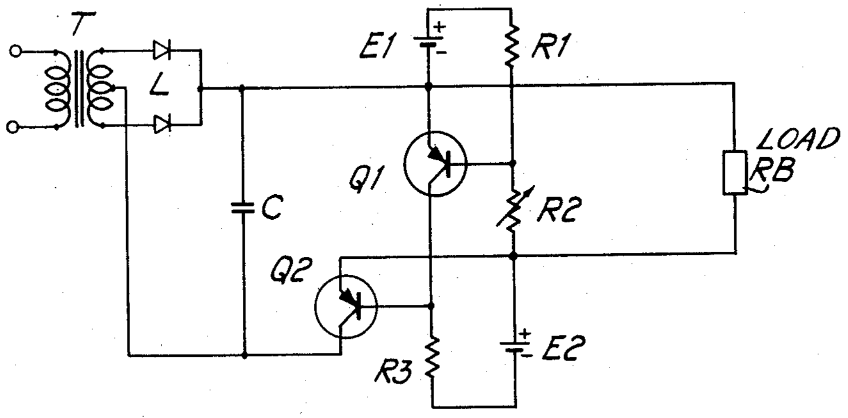
FIGURE 1 is a circuit diagram of a conventional D.C. control device with transistors.

The circuit according to FIGURE 1 comprises a transformer T, a rectifier L, two transistors Q1 and Q2, resistors R1, R2 and R3, direct current sources E1 and E2 producing constant reference voltages, and a load RB.

Q2 is the series transistor through which the load current flows. Transistor Q1, resistors R1, R2 and R3 and voltage sources E1 and E2 form a control amplifier which controls the series transistor Q2. If transistors Q1 and Q2 have a high gain, the voltage across the load will be about equal to the reference voltage from source E1 multiplied by the ratio of resistance R2 to resistance R1. Resistance R2 is manually variable, and hereby the load voltage can be adjusted to any desired value within a certain voltage range, for instance 0 to 50 volts.

The power source in FIGURE 1 consists of the rectifier L to which alternating current is supplied over the transformer T. Across the collector-emitter path of transistor Q2 there will be a voltage which is substantially equal to the difference between the output voltage of rectifier L and the voltage across the load RB. If the load voltage

2 has been adjusted to a low value, so that this difference is large, the power in transistor Q2 will obviously be large.

A known method of reducing the power in the device in FIGURE 1 consists in providing the power supply source with a manually operable regulator, for instance a continuously adjustable autotransformer connected to the primary winding of transformer T, the control means of which is mechanically coupled with that of the variable resistor R2 so that the supply voltage as well as the load voltage varies in the same way when the control means are operated. This arrangement, however, does not afford a wholly satisfactory reduction of the power losses and is comparatively costly.

Figure 2:
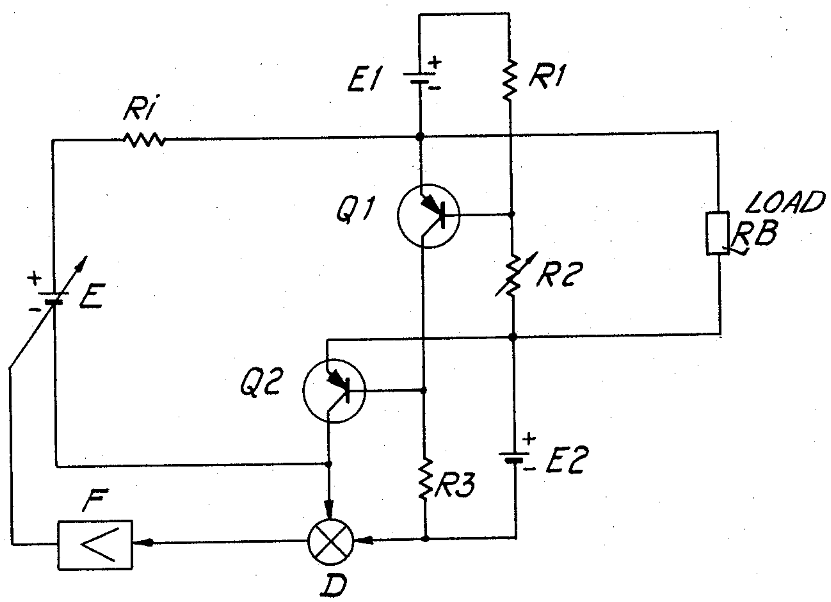
FIGURE 2 is a circuit diagram of the same device modified in accordance with the invention.

A more effective means for reducing the power losses in the series transistor is afforded by the present invention which is illustrated schematically in FIGURE 2. The device comprises a difference circuit D arranged to compare the voltage drop across transistor Q2 with the constant voltage from the direct current source E2 and to deliver an output voltage equal to or proportional to the difference betwene said voltages. This difference voltage is amplified in amplifier F and applied to a regulator for regulating the electromotive force of the power supply source. In FIGURE 2 the power supply source is schematically represented as an electromotive force E and an internal resistance R1, and said regulator is indicated by the arrow through E. The amplified output voltage from D serves as control voltage for the regulator. If the load voltage is changed, the voltage across the series transistor Q2 tends to change, and hence the difference voltage from D also tends to change. The change in the output voltage from D actuates the regulator so that the power supply voltage is changed in such a manner that the change in the voltage across the series transistor is opposed. Thus the voltage across the series transistor will vary only slightly even in the case of large changes in the load voltage. Preferably the device is so designed that the voltage across the series transistor becomes about equal to the voltage from the reference voltage source E2.

The regulator should of course be of a type working with small losses so that the reduction of the power losses in the series transistor is not outweighed by losses in the regulator. Regulators suitable for the purpose of this invention may be of the chopper type or the magnetic type.

Figure 3:
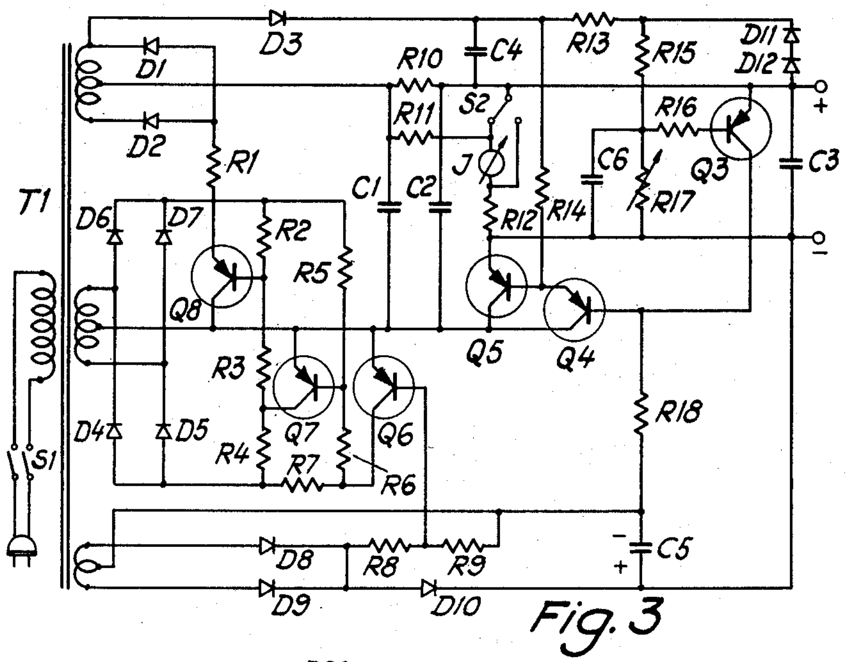
FIGURE 3 is a circuit diagram of a practical embodiment of the invention.

FIGURE 3 is a circuit diagram for an embodiment of the invention having a regulator of the electronic chopper type. The direct current output terminals are seen to the right of the figure and are marked with plus and minus signs. Transistor Q3 is the control amplifier transistor corresponding to transistor Q1 in FIGURE 2. The resistor R17 is the variable resistor by means of which the output voltage can be set to a desired value. D11 and D12 are two series connected zener diodes through which direct current is passed from a direct current source formed by rectifier diode D3 and a secondary winding on transformer T1. In accordance with the known characteristics of zener diodes the voltage across the diodes D11 and D12 will be constant and independent of the current through them. Diodes D11 and D12 thus form a constant reference voltage source corresponding to E1 in FIGURE 2.

The transistor Q5 is the series transistor corresponding to Q2 in FIGURE 2. However, in this embodiment the series transistor Q5 is not controlled directly from the control amplifier transistor Q3 but through the intermediate transistor Q4 connected in tandem with transistor Q5. Transistor Q4 amplifies the control current for transistor Q5 so that a more efficient control action is attained.

A measuring instrument J combined with resistors R11 and R12 and a switch S2 is connected in the output circuit so that the instrument measures the voltage across the load or current through the load according to the position of switch S2.

The output power is supplied from a full-wave rectifier comprising diodes D1 and D2 connected to a secondary winding of transformer T1. A power transistor Q8 is connected with the emitter-collector path in series with the load circuit of rectifier D1—D2. Transistor Q8 is controlled by output pulses from an amplifier comprising transistors Q6 and Q7 so that transistor Q8 is alternately cut off and made conductive. Thus transistor Q8 acts as a chopper or switch which alternately interrupts and closes the load circuit so that the output from the power rectifier D1—D2 is chopped into pulses. These pulses are smoothed by suitable filter means including resistor R1 and condenser C1 to produce a steady direct voltage. The value of this voltage will be dependent on the on-to-off ratio of the switching transistor Q8, i.e., the ratio of the intervals during which the transistor is conductive to the intervals during which the transistor is cut-off. This ratio is determined by the repetition rate and the width of the control pulses applied from transistor Q7 to transistor Q8. As will appear from the following description the repetition rate will be an integral multiple of the frequency of the alternating voltage supplied to transformer T1, while the width of the pulses will be dependent on the voltage across transistor Q5.

The required operating voltages for transistors Q6 and Q7 are obtained from rectifier means comprising diodes D4, D5, D6 and D7 which are connected to a second secondary winding on transformer T1.

A full-wave rectifier comprising diodes D8 and D9 connected to a third secondary winding of transformer T1 produces a pulsating direct voltage across a voltage divider consisting of resistors R8 and R9. The same rectifier in combination with rectifier diode D10 also charges condenser C5. A steady voltage with the polarity indicated in the figure will thus be present across condenser C5 and serves as reference voltage corresponding to that produced by reference voltage source E2 in FIGURE 2.

The base electrode of transistor Q6 is connected to the junction of resistors R8 and R9, and the emitter of the transistor Q6 is connected to the collector of transistor Q5. The potential of the base of transistor Q6 with respect to the emitter of the same transistor will be equal to the pulsating voltage across resistor R9 added to the difference between the voltage across transistor Q5 and the voltage across condenser C5. The latter voltage is made somewhat larger than the normal voltage across transistor Q5, and hence the said difference is negative. The maximum amplitude of the pulsating voltage across resistor R9 is larger than said difference, and therefore during each half-cycle of the alternating voltage supplied to transformer T1 the potential of the base of transistor Q6 with respect to its emitter will change polarity twice, the polarity being negative at the beginning and the end of each half-cycle and positive during an intermediate interval. As long as said potential is negative the emitter-collector path of transistor Q6 is conductive, whereas if the potential is positive, the transistor is cut-off. Hence the output of transistor Q6 will be pulses which are amplified by transistor Q7 and applied to control the switching of transistor Q8.

Since the base-emitter potential of transistor Q6 has a non-rectangular waveform, the times when said change of polarity occur will be dependent on the voltage across the transistor Q5. Assuming that the voltage across transistor Q5 increase while the voltage across condenser C5 remains constant, the intervals during which the said potential is positive will be lengthened while the negative intervals will be correspondingly shortened. Hence the length of the control pulses applied to switching transistor Q8 is reduced, whereby the on-to-off ratio of transistor Q8 is reduced. This results in the total output voltage from power supply rectifier D1—D2 being reduced.

Thus the increase of voltage across the series transistor Q5 caused by the lowering of the load voltage will be moderate even if the load voltage is lowered by a large amount.

Figure 4:
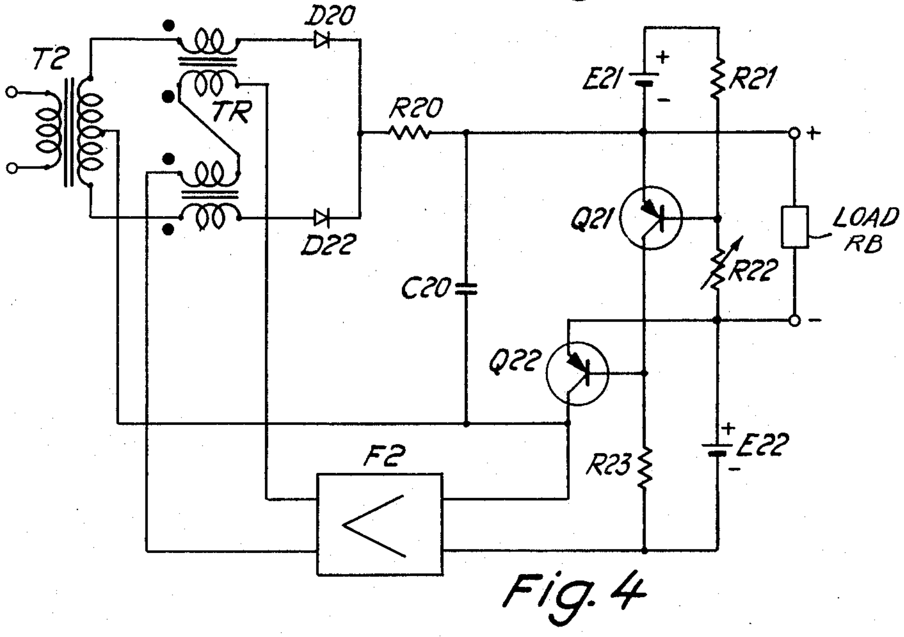
FIGURE 4 is a circuit diagram of another practical embodiment of the invention.

FIGURE 4 is a circuit diagram of an embodiment of the invention having a low-loss regulator of the magnetic type. The regulator comprises a so-called transductor, i.e., a direct current premagnetized reactor, TR the alternating current windings of which are connected in series between the terminals of the secondary winding of the power supply transformer T2 and rectifier diodes D20 and D21. The output voltage from the full-wave rectifier formed by diodes D20 and D21 is smoothed by a filter comprising resistor R20 and condenser C20.

The direct current windings of transductor TR are connected in series to the output of a D.C. amplifier F2. The voltage applied to the input of amplifier F2 is the difference between the reference voltage from voltage source E22 and the voltage across the series transistor Q22. The reference voltage of E22 is so chosen in relation to the normal voltage across transistor Q22 that when the latter voltage increases, the output current from the amplifier F2 is reduced. Hereby the impedance of the A.C. windings of transductor TR is increased and the output voltage of the rectifier D20—D21 is consequently reduced so that the rise in voltage across transistor Q22 is opposed.

The amplifier F2 may be of any conventional type, e.g., a transistor amplifier, connected to receive the necessary operating voltages from a rectifier fed from an additional winding on transformer T2.

The necessary reference voltages represented by E21 and E22 in FIGURE 4 may be obtained in the same manner as in the embodiment shown in FIGURE 3, i.e., by means of zener diodes and a condenser connected to rectifiers fed from the power supply transformer.

The embodiments described above are given by way of example only and may be modified in many ways within the scope of the invention.

What is claimed is:

1. A power supply device for deriving a stabilized direct voltage from a voltage source, comprising in combination: an output circuit connecting the voltage source with output terminals for connecting a load to the device, a transistor having a first and a second electrode connected in series with said output circuit, means connected across said output terminals and responsive to changes in the voltage across said terminals to control the current through said transistor in a sense to counteract said changes in voltage, switching means connected in series with said output circuit and responsive to a voltage of one polarity to cut off said output circuit and responsive to a voltage of the opposite polarity to open said circuit, a source of reference voltage, means for producing a unidirectional voltage of periodically varying magnitude, means for combining the voltage between said first and second electrodes of the transistor with said unidirectional voltage of varying magnitude and with the voltage from said reference voltage source to produce a resulting control voltage of periodically changing polarity, and means for applying said control voltage to control said switching means.

2. A power supply device for deriving a direct voltage from a voltage source, comprising in combination: an output circuit for connecting the voltage source with output terminals for connecting a load to the device, a first transistor having a pair of electrodes connected in series in said output circuit, means connected to said output terminals and to said first transistor, said means being responsive to changes in the voltage between said output terimnals to control the current through said first transistor in a sense to counteract said changes in the voltage between said output electrodes, a second transistor having a pair of electrodes connected in series with said output circuit, a reference voltage source for producing a substantially constant references voltage, means for producing a pulsating voltage with a non-rectangular wave form, means for combining the voltage across said pair of electrodes of the first transistor with said reference voltage and said pulsating voltage to produce a resulting control voltage of periodically changing polarity, and means for applying said control voltage to said second transistor to cause the second transistor to be alternately cut off and made conductive at the polarity changes of said control voltage.

3. A power supply device as claimed in claim 2, in which said means for applying the control voltage to the second transistor comprises amplifying means for amplifying said control voltage.

4. A power supply device for deriving a stabilized direct voltage from a voltage source to a load comprising in combination: a load circuit connecting the voltage source with the load and including the emitter-collector paths of a first and a second transistor, means responsive to an increase of the load voltage for increasing the voltage across the emitter-collector path of said first transistor and vice versa, a source of substantially constant reference voltage, means for producing a pulsating voltage with a non-rectangular wave form, means for combining the voltage drop across the emitter-collector path of said first transistor with said reference voltage and said pulsating voltage to produce a control voltage of periodically changing polarity and means for applying said control voltage to said second transistor to cause the emitter-collector path of the second transistor to be alternately cut off and made conductive at the times for polarity changes of said control voltage.

5. A power supply device as claimed in claim 2 for deriving a stabilized direct voltage from an alternating voltage source, in which said means for producing a pulsating voltage with a non-rectangular wave form includes rectifying means connected to receive input alternating voltage from said alternating voltage source.

References Cited in the file of this patent

UNITED STATES PATENTS

| | | |
|---|---|---|
| 2,776,382 | Jensen | Jan. 1, 1957 |
| 2,815,479 | Rechnitzer | Dec. 3, 1957 |
| 2,903,640 | Bixby | Sept. 8, 1959 |
| 2,906,941 | Brolin | Sept. 29, 1959 |
| 2,915,693 | Harrison | Dec. 1, 1959 |
| 2,936,413 | Searcy | May 10, 1960 |